United States Patent [19]
Ohmori

[11] Patent Number: 5,136,464
[45] Date of Patent: Aug. 4, 1992

[54] HOUSING STRUCTURE FOR HOUSING A PLURALITY OF ELECTRIC COMPONENTS

[75] Inventor: Akimitsu Ohmori, Tokorozawa, Japan

[73] Assignee: Kabushiki Kaisha Toshiba, Kawasaki, Japan

[21] Appl. No.: 687,734

[22] Filed: Apr. 19, 1991

[30] Foreign Application Priority Data

Apr. 20, 1990 [JP] Japan .................................. 2-103120

[51] Int. Cl.⁵ .............................................. H05K 7/20
[52] U.S. Cl. ...................................... 361/384; 361/390
[58] Field of Search ................................ 361/383–384, 361/390, 391, 395, 399

[56] References Cited

U.S. PATENT DOCUMENTS 3,387,648  6/1968  Ward, Jr. et al. .................... 361/384
4,730,233  3/1988  Osterman ............................ 361/383
4,765,397  8/1988  Chrysler et al. ..................... 361/384

FOREIGN PATENT DOCUMENTS 63-187394 11/1988 Japan .

OTHER PUBLICATIONS

Hammer et al., "IBM Technical Disclosure Bulletin Ventilation System for Data Processing Systems", vol. 17, No. 9, Feb. 1975, pp. 2529–2530.

Primary Examiner—Gregory D. Thompson
Attorney, Agent, or Firm—Oblon, Spivak, McClelland, Maier & Neustadt

[57] ABSTRACT

A housing structure for housing a plurality of electric components includes a skeleton frame, an air intake section, an air exhaust section, an air passage section, a plurality of electric component housing bodies, and a confluence preventing member. The skeleton frame has a polyhedron space defined therein. The air intake port introduces air into the polyhedron space in the skeleton frame from the exterior thereof. The air exhaust section exhausts air from the polyhedron space in the skeleton frame to the exterior thereof. The air passage section is formed in the polyhedron space in the skeleton frame. The plurality of electric component housing bodies receive a plurality of electric components in a two- or more-storied configuration. The confluence preventing member prevents air exhausted from a lower side electric component housing body and air introduced into an upper side electric component housing body from being combined together.

17 Claims, 13 Drawing Sheets

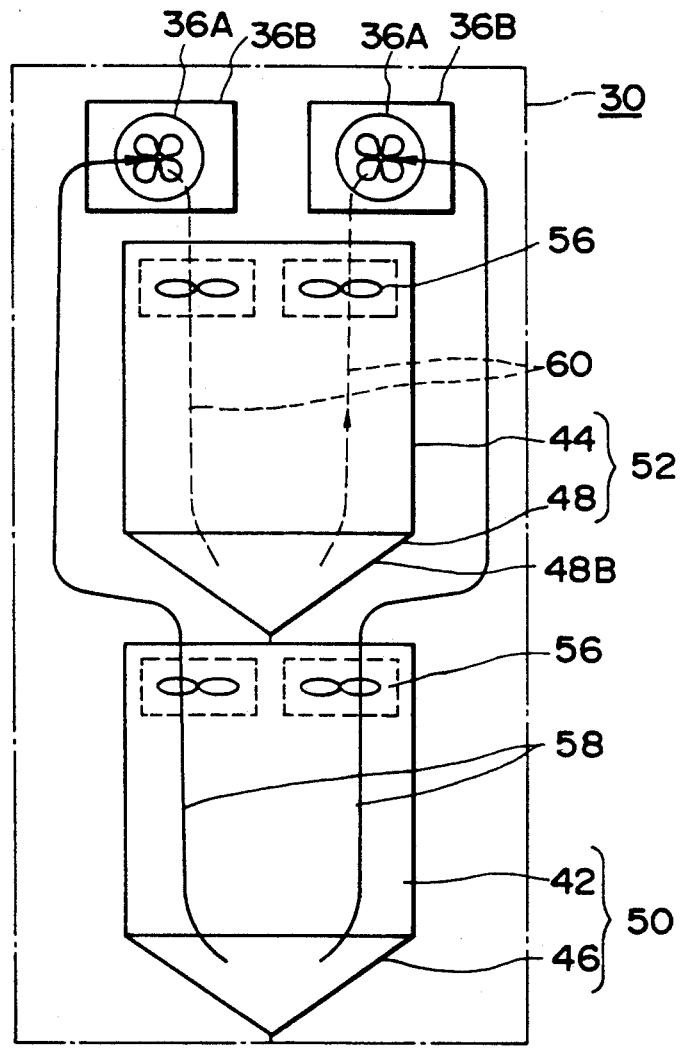
F I G. 6

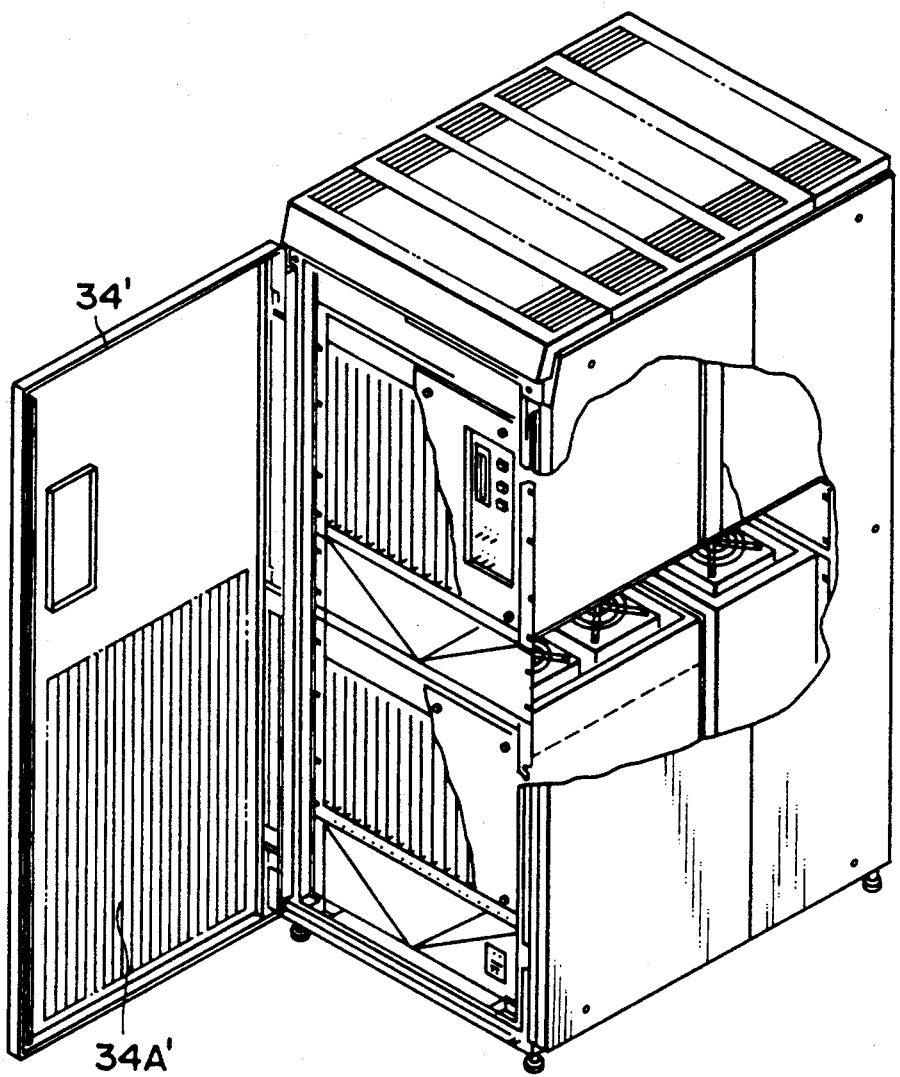
F I G. 16

HOUSING STRUCTURE FOR HOUSING A PLURALITY OF ELECTRIC COMPONENTS

BACKGROUND OF THE INVENTION

1. Field of the Invention

This invention relates to a housing structure for housing a plurality of electric components and more particularly to a housing structure having an improved cooling characteristic.

2. Description of the Related Art

High mounting efficiency is required for this type of housing structure. This can be realized by arranging a plurality of electric components which are to-be-received members in a two- or more-storied configuration and contributes to reduction in the area for installation. Further, in a case where the electric components are hardware units such as a central processing unit or memory unit of a computer system, the following problem may be provided. That is, this type of electric component is formed to include a plurality of PC boards (print circuit boards) and a plurality of semiconductor elements such as IC elements, LSI elements and ULSI elements are mounted on the PC board. This type of semiconductor element is required to be operated under the optimum temperature condition, and at the same time, a large amount of heat is generated because of its high mounting density. Therefore, this type of housing structure is required to have the high mounting density described before and an effective cooling characteristic.

The conventional housing structure is explained with reference to FIG. 1. As shown in FIG. 1, two electric components 102 and 104 are housed or received on the upper and lower rows in a housing structure 100, thus realizing a two-storied configuration. The electric component 102 is disposed on the lower side of the housing structure 100 and the electric component 104 is disposed on the upper side of the housing structure 100. Each of the electric components 102 and 104 has a plurality of PC boards 106. An air intake port (not shown) is formed in an area ranging from the intermediate portion to the lower portion of the housing structure 100 and an air exhaust port is formed in the upper portion thereof.

Therefore, fresh air 108 introduced from the intake port of the housing structure 100 flows into the electric component 102 disposed on the lower side from the underside surface thereof and is used as intake air (cooling air) for the electric component 102. The intake air 108 upwardly passes in the electric component 102 on the lower side. Heat is carried away from the plurality of PC boards of the lower side electric component 102 by the flow of air. The thus heated intake air 108 flows out from the upper side surface of the lower side electric component 102 and acts as exhaust air 110 from the lower side electric component 102. The exhaust air 110 acts part of intake air fed to the upper side electric component 104. That is, the exhaust air 110 flows into the upper side electric component 104. Further, fresh air 112 introduced via the intake port of the housing structure 100 also flows into the upper side electric component 104. Therefore, the exhaust air 110 exhausted from the lower side electric component 102 and the fresh air 112 introduced via the intake port are combined together in the upper side electric component 104 and act as intake air (cooling air) 114 for the upper side electric component 104. The intake air 114 upwardly passes in the upper side electric component 104. Heat is carried away from the PC boards of the upper side electric component 104 by the air flow. After this, the intake air 114 is exhausted from the upper side surface of the upper side electric component 104 and is treated as exhaust air 116 from the upper side electric component 104. Finally, the exhaust air 116 is exhausted from the exhaust port of the housing structure 100 to the exterior thereof.

However, in the conventional housing structure as shown in FIG. 1, the following problem concerning the cooling characteristic is provided. That is, since air for cooling the lower side electric component 102 is the air 108 of relatively low temperature introduced via the intake port, cooling of the lower side electric component 102 can be effectively effected. However, since air for cooling the upper side electric component 104 is the air 114 of relatively high temperature obtained by combining the air 112 of relatively low temperature introduced via the intake port and the air 110 of high temperature exhausted from the lower side electric component 102, cooling of the upper side electric component 104 cannot be effectively effected. For this reason, variations may occur in the electrical characteristics caused by the cooling characteristics of the lower side electric component 102 and the upper side electric component 104. Therefore, the variations may extends the computer system to be erroneously operated.

SUMMARY OF THE INVENTION

An object of this invention is to provide a housing structure for housing a plurality of electric components and having an improved cooling characteristic for the electric components.

The above object can be attained by the following housing structure.

That is, the housing structure for housing a plurality of electric components comprises:

a skeleton frame member having a polyhedron space defined therein;

an air intake section mounted on the skeleton frame member, for introducing air into the polyhedron space in the skeleton frame member from the exterior thereof;

an air exhaust section mounted on the skeleton frame member, for exhausting air from the polyhedron space in the skeleton frame member to the exterior thereof;

an air passage section formed between the air intake section and the air exhaust section in the polyhedron space in the skeleton frame member;

a plurality of electric component housing bodies disposed in the air passage section, for housing a plurality of electric components in a two- or more-storied configuration; and confluence preventing means disposed in the air passage section, for preventing air exhausted from the lower side electric component housing body and air introduced into the upper side electric component housing body from being combined together.

Further the above object can be attained by the following housing structure.

That is, the housing structure for housing a plurality of electric components comprises:

a skeleton frame member having a space defined therein for housing a plurality of electric components in a two- or more-storied configuration;

a plurality of electric component housing bodies disposed in said skeleton frame member, for housing a plurality of electric components in said two-or more-storied configuration;

an air passage section disposed between at least one air intake section and at lest one air exhaust section formed in the skeleton frame member; and confluence preventing means disposed in the air passage section, for preventing air exhausted from a lower side electric component housing body and air introduced into an upper side electric component housing body from being combined together.

More further the above object can be attained by the following housing structure.

That is, the housing structure for housing a plurality of electric components comprises:

a skeleton frame member having a polyhedron space defined therein;

a plurality of electric component housing means disposed in said skeleton frame member for housing a plurality of electric components in said two-or more-storied configuration;

an air intake section disposed on the front side of said skeleton frame member, for introducing air into the polyhedron space in said skeleton frame member from the exterior thereof;

an exhaust section disposed on the rear side of said skeleton frame member, for exhausting air from the polyhedron space in said skeleton from member to the exterior thereof;

confluence preventing means disposed in said plurality of electric component housing means for preventing air exhausted from a lower side electric component housing means of said plurality of electric component housing means and air introduced into an upper side electric component housing means of said plurality of electric component housing means from being combined together; and an air passage section formed between said air intake section and said air exhaust section in the polyhedron space in said skeleton frame member, said air passage section includes a first air flow passage line passing through the inside of said upper side electric component housing means for cooling and a second air flow passage line passing through the inside of said lower side electric component housing means and the outside of said lower side electric component housing means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a schematic front view showing the flow of air in the housing structure shown in FIG. 4 together with the housing structure;

FIG. 16 is a perspective view showing a housing structure including a front panel having a structure different from that of the housing structure shown in FIG. 4.

DETAILED DESCRIPTION OF THE PREFERRED EMBODIMENTS

There will now be described an embodiment of this invention with reference to FIGS. 2, 3A, 3B and 3C.

Figure 1:
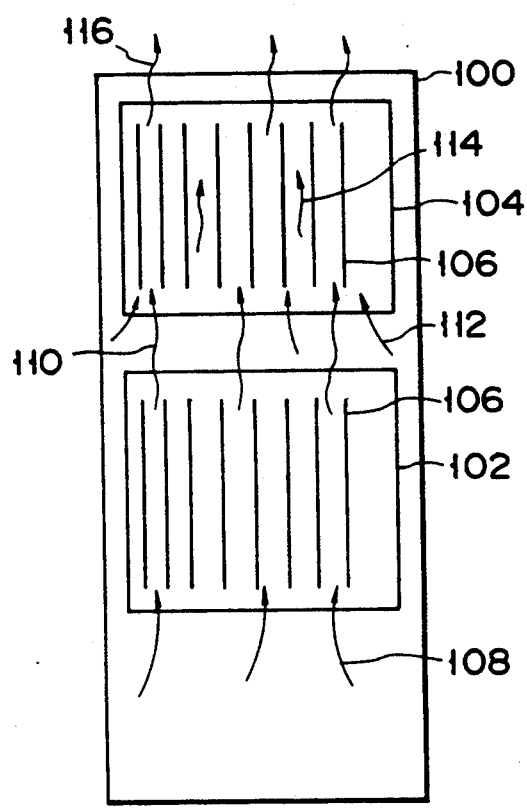
FIG. 1 is a schematic front view showing the main portion of a conventional housing structure.
Figure 2:
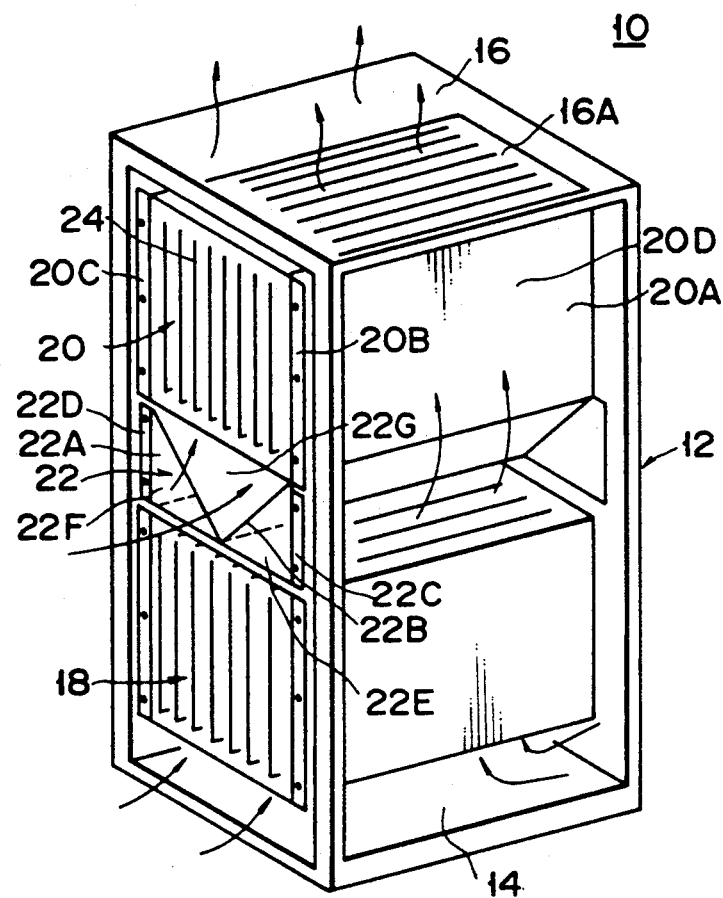
FIG. 2 is a schematic perspective view showing a housing structure according to a first embodiment of this invention.

In FIG. 2, the main portion of a housing structure according to the first embodiment is shown, but the front, rear and side panels are omitted so as to make it easy to understand the internal construction of the housing structure. However, it should be noted that the front, rear and side panels are formed as is clearly understood by referring to FIG. 4 or 16. Further, the front, rear and side panels mounted on the housing structure of the first embodiment are substantially the same as the front, rear and side panels shown in FIG. 4 or 16. Partial curves having arrows attached thereto shown in FIGS. 2, 3A, 3B and 3C indicate the flow of air.

As shown in FIG. 2, the housing structure 10 of the first embodiment includes a skeleton frame member 12 having a hexahedron space as a polyhedron space defined therein, front, rear and side panels (not shown) formed on the front, rear and side surfaces of the skeleton frame member 12, a bottom panel 14 formed on the bottom surface of the skeleton frame member 12, an upper panel 16 formed on the upper surface of the skeleton frame member 12, a lower side PC board supporting section 18 disposed in the lower space of the skeleton frame member 12, for housing and supporting a plurality of PC boards 24, an upper side PC board supporting section 20 disposed in the upper space of the skeleton frame member 12, and a confluence preventing section 22 arranged in the intermediate space of the skeleton frame member 12 between the lower side PC board supporting section 18 and the upper side PC board supporting section 20. In this case, the internal space of the skeleton frame member 12 constitutes an air passing section. Thus, the lower side PC board supporting section 18 serving as the lower side electric component housing body and the upper side PC board supporting section 20 serving as the upper side electric component housing body are arranged in the air passage section.

The skeleton frame member 12 is formed in a hexahedron form by subjecting a metal skeleton member of, for example, iron. In this case, process for forming the skeleton frame member 12 is bending process, welding process, rivet-connecting process, screw-cramping process or function process.

An air exhaust port 16A is formed in the upper panel 16. The air exhaust port 16A is constructed by a plurality of slits. A plurality of slits for introducing and exhausting air are not formed in the bottom panel 14, but it is possible to form the slits as required. An air intake port (not shown) is formed in the front panel which is not shown. The air intake port is constructed by a plurality of slits.

Since the lower side PC board supporting section 18 and the upper side PC board supporting section 20 are formed with the same construction, the upper side PC board supporting section 20 is explained in detail as the representative. The PC board supporting section 20 is a box-like body having neither a bottom plate nor a upper plate and having plate-like flanges 20B and 20C attached to the side plates 20A on both sides. One of the side plates 20A cannot be seen in the drawing. A plurality of PC boards 24 are received in the box-like body and the PC plates 24 are supported by means of an electrical/mechanical device such as a connector (not shown). The plate-like flanges 20B and 20C are fixed on the skeleton frame member 12 by use of screws (not shown). Therefore, the PC board supporting section 20 can be fixed in a preset position of the skeleton frame member 12. Each of the PC boards 24 is arranged such that the surface thereof may be set in parallel with the side plate 20A of the PC plate supporting section 20. Further, an air exhaust cavity 20D is formed between the side plates on both sides of the upper side PC board supporting section 20 and side panels (not shown).

The confluence preventing section 22 includes a skeleton frame 22A and a confluence preventing member 22B disposed in the skeleton frame 22A. Plate-like flanges 22C and 22D are mounted on the skeleton frame 22A. The plate-like flanges 22C and 22D are fixed on the skeleton frame 12 by means of screws (not shown). Therefore, the confluence preventing section 22 can be fixed in a preset position of the skeleton frame 12. The confluence preventing member 22B is a member obtained by forming a flat plate to have a "V-shaped" cross section. The ridged line of the confluence preventing member 22B is set to face the lower side PC board supporting section 18. With this construction, portions 22E and 22F made in spatial communication with the lower side PC board supporting section 18 and a portion 22G made in spatial communication with the upper side PC board supporting section 16 are formed at the end portion of the confluence preventing section 22.

With the above construction, fresh air introduced via the intake port of the front panel (not shown) is conducted to the internal space of the lower side PC board supporting section 18. Therefore, fresh air suitable for cooling can be supplied to the PC boards 24 received in the internal space of the lower side PC board supporting section 18. Then, it is exhausted from the upper end portion of the lower side PC board supporting section 16. Used air exhausted from the lower side PC board supporting section 18 is introduced into the air exhaust cavity 20D via the portions 22E and 22F of the confluence preventing section 22. Then, it is exhausted to the exterior via the air exhaust port 16A of the upper panel 16. Further, fresh air introduced via the intake port of the front panel (not shown) is guided into the internal space of the upper side PC board supporting section 20 via the portion 22G of the confluence preventing section 22. Therefore, fresh air suitable for cooling can be supplied to the PC boards 24 received in the internal space of the upper side PC board supporting section 20. Then, it is exhausted to the exterior via the air exhaust port 16A of the upper panel 16.

Figure 3A:
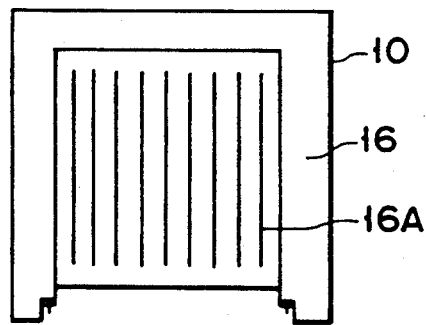
FIG. 3A is a top plan view of the housing structure shown in FIG. 2.
Figures 3B, 3C:
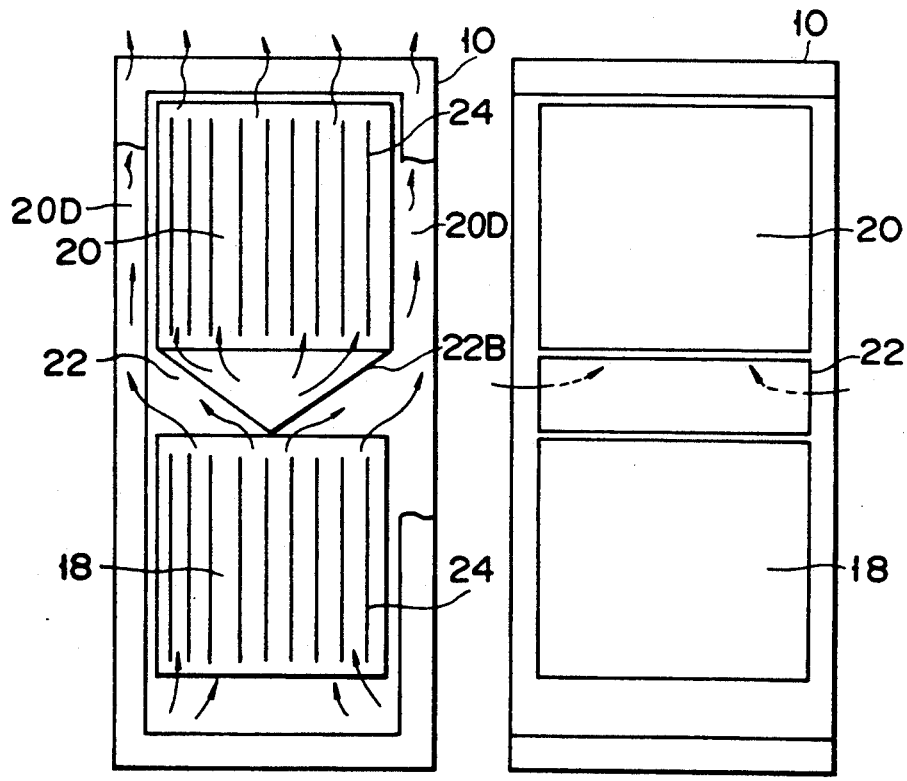
FIG. 3B is a front view of the housing structure shown in FIG. 2.
FIG. 3C is a side view of the housing structure shown in FIG. 2.

The operation of the above-described first embodiment is explained with reference to FIGS. 3A, 3B and 3C. That is, the confluence preventing section 22 is disposed between the lower side PC board supporting section 18 and the upper side PC board supporting section 20. The confluence preventing member 22B of the confluence preventing section 22 controls the flow of air introduced via the intake port of the front panel. That is, the confluence preventing member 22B causes the used air exhausted from the lower side PC board supporting section 18 to be introduced into the air exhaust cavity 20D formed in the side portion of the upper side PC board supporting section 20 without introducing the same into the upper side PC board supporting section 20. Therefore, only fresh air which has been introduced via the intake port of the front panel and is suitable for cooling is introduced into the internal space of the upper side PC board supporting section 20. Of course, fresh air which has been introduced via the intake port of the front panel and is suitable for cooling is introduced into the internal space of the lower side PC board supporting section 18. This will be easily understood by referring to partial curves attached with arrows indicating air flow paths. It is understood in this example that two air flow passages are formed.

As described above, since air for cooling the PC boards 24 received in the internal space of the lower side PC board supporting section 18 is unused fresh air which has been introduced via the intake port of the front panel and is suitable for cooling, the PC boards 24 received in the internal space of the lower side PC board supporting section 18 can be effectively cooled. Further, since air for cooling the PC boards 24 received in the internal space of the upper side PC board supporting section 20 is unused fresh air which has been introduced via the intake port of the front panel and is suitable for cooling, the PC boards 24 received in the internal space of the upper side PC board supporting section 20 can be effectively cooled. Therefore, variations will not occur in the electrical characteristics caused by the cooling characteristics of the PC boards 24 received in the internal space of the lower side PC board supporting section 18 and the PC boards 24 received in the internal space of the upper side PC board supporting section 20. For reason, the computer system may be prevented from being erroneously operated.

The main portion of the housing structure 10 is the skeleton frame 12 and the intermediate portion of the skeleton frame 12 is mechanically weak, but since the confluence preventing section 22 is disposed in the intermediate space of the skeleton frame 12, the rigidity of the skeleton frame 12 can be enhanced. Further, since the confluence preventing section 22 includes the confluence preventing member 22B formed to have a "V-shaped" cross section, the trussed structure can be formed and the rigidity thereof can be enhanced.

Figure 4:
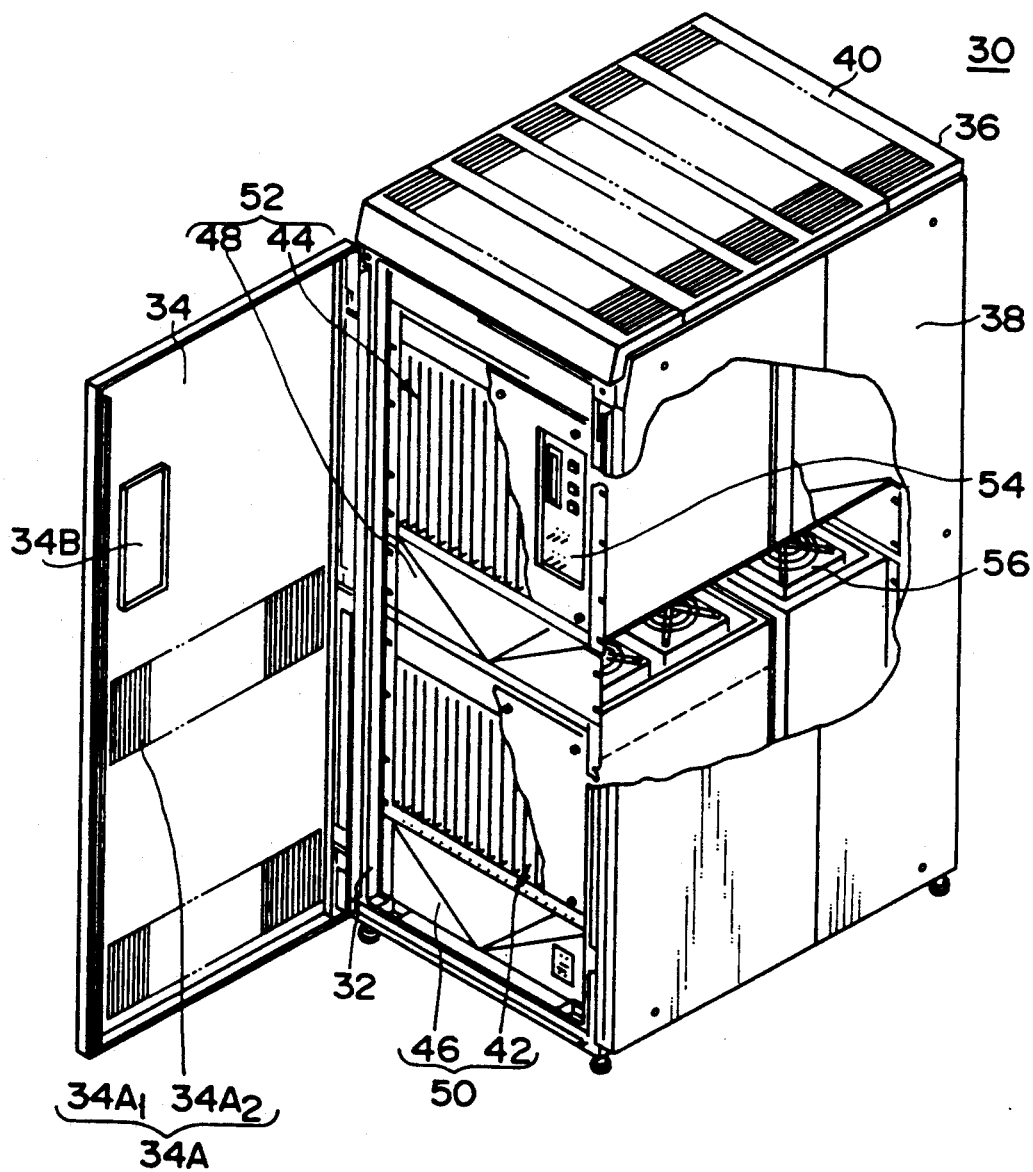
FIG. 4 is a perspective view showing a housing structure according to a second embodiment of this invention.

Next, the second embodiment of this invention is explained with reference to FIGS. 4 to 8. As shown in FIG. 4, a housing structure 30 in the second embodiment includes a skeleton frame 32 having a hexahedron space defined therein as a polyhedron space, a front panel 34 disposed on the front side of the skeleton frame 32, a rear panel 36 formed on the rear side thereof, a right-side panel 38 formed on the right side thereof, a left-side panel (not shown) formed on the left side thereof, a bottom panel (not shown) formed on the bottom surface of the skeleton frame 32, an upper side panel 40 formed on the upper surface of the skeleton frame 32, a lower side PC board supporting section 4 disposed in the lower space of the skeleton frame 32, for housing and supporting a plurality of PC boards 24, an upper side PC board supporting section 44 disposed in the upper space of the skeleton frame member 32, a confluence preventing section 46 arranged below the lower side PC board supporting section 18 in the lower space of the skeleton frame member 32, and a confluence preventing section 48 arranged below the upper side PC board supporting section 20 in the intermediate space of the skeleton frame member 32. In this case, the lower side PC board supporting section 42 and the confluence preventing section 46 constitute a lower side housing unit 50 and the upper side PC board supporting section 44 and the confluence preventing section 48 constitute an upper side housing unit 52. At this time, the internal space of the skeleton frame 32 constitutes an air passage section. Thus, the lower side housing unit 50 serving as the lower side electric component housing body and the upper side housing unit 52 serving as the upper side electric component housing body are arranged in the air passage section.

The skeleton frame 32 is formed in a hexahedron form by subjecting a metal skeleton member of, for example, iron. In this case, processes for forming the skeleton frame 32 is bending process, welding process, rivet-connecting process, screw-cramping process or junction process.

An air intake port 34A is formed in the front panel 34. The air intake port 34A is formed to have a portion 34A$_1$ for the lower side PC board supporting section 42 and a portion 34A$_2$ for the upper side PC board supporting section 44. Each of the portions 34A$_1$ and 34A$_2$ of the air intake port 34A is constructed by a plurality of slits. An access window 34B for permitting operation of an electrical/mechanical device 54 such as a panel switch and a keyboard provided on the upper side PC board supporting section 44 is formed in the front panel 34. As shown in FIG. 6, an electric fan 36A is mounted on the upper portion of the rear panel 36 a at least one forced air-ventilating means and at least one air exhaust port 36B is provided.

Figure 5:
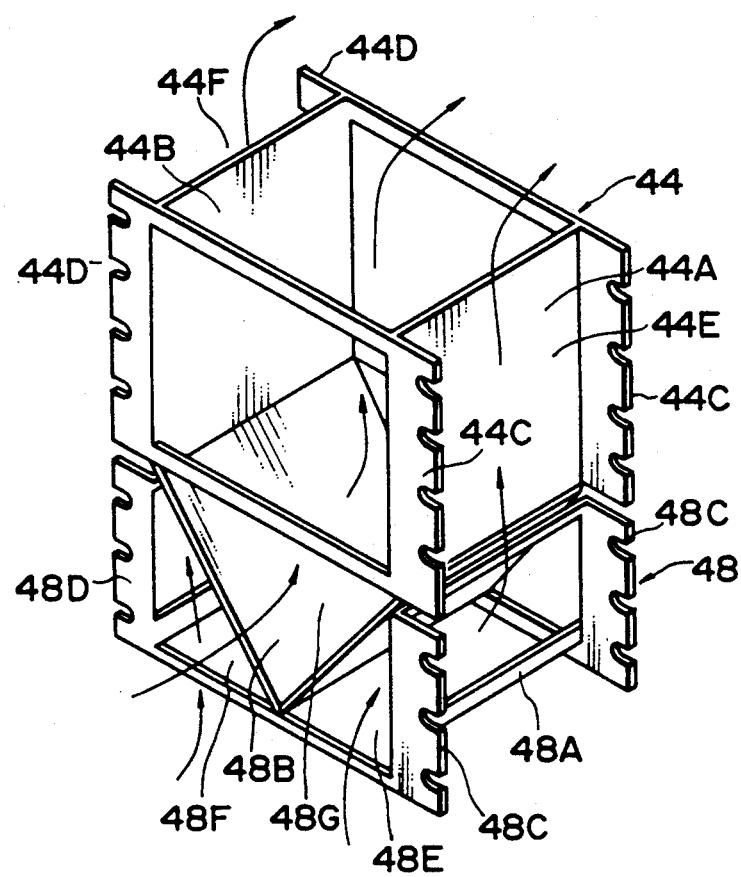
FIG. 5 is a perspective view showing a housing unit having a PC board supporting section and a confluence preventing section disposed in the housing structure shown in FIG. 4.

The lower side housing unit 50 which is constituted by the lower side PC board supporting section 42 and the confluence preventing section 46 and the upper side housing unit 52 which is constituted by the upper side PC board supporting section 44 and the confluence preventing section 48 are formed with the same construction, and therefore the upper side housing unit 54 is explained in detail as the representative with reference to FIG. 5. As shown in FIG. 5, the PC board supporting section 44 is a box-like body having neither the top plate nor the bottom plate and having plate-like flanges 44C and 44D attached to the side plates 44A and 44B on both sides. A plurality of PC boards 24 are received in the box-like body and the PC boards 24 are supported by means of an electrical/mechanical device such as a connector (not shown). The plate-like flanges 44C and 44D are fixed on the skeleton frame 32 by use of screws (not shown). Therefore, the PC board supporting section 44 can be fixed in a preset position of the skeleton frame 32. Each of the PC boards 24 is arranged such that the surface thereof may be set in parallel with the side plates 44A and 44B of the PC plate supporting section 44. Further, an air exhaust cavity 44E is formed between the side plate 44A of the upper side PC board supporting section 44 and the right-side panel 38. An air exhaust cavity 44F is formed between the side plate 44B of the upper side PC board supporting section 44 and the left-side panel (not shown).

As shown in FIG. 4, an electric fan 56 is mounted as at least one forced ventilating means on the upper portion of at least the lower side housing unit 50 or the upper portions of the lower side housing unit 50 and the upper side housing unit 54. Specifically, the electric fan 56 serving as the forced ventilating means is mounted in a opening formed in the upper portion of the PC board supporting section 42.

The confluence preventing section 48 includes a skeleton frame 48A and a confluence preventing member 48B disposed in the skeleton frame 48A. Plate-like flanges 48C and 48D are mounted on the skeleton frame 22A. The plate-like flanges 48C and 48D are fixed on the skeleton frame 32 by means of screws (not shown). Therefore, the confluence preventing section 48 can be fixed in a preset position of the skeleton frame 32. The confluence preventing member 48B is a member obtained by forming a flat plate to have a "V-shaped" cross section. The ridged line of the confluence preventing member 48B is set to face the lower side PC board supporting section 42. With this construction, portions 48E and 48F made in spatial communication with the lower side PC board supporting section 42 and a portion 48G made in spatial communication with the upper side PC board supporting section 44 are formed at the end portion of the confluence preventing section 48.

With the above construction, like the first embodiment, fresh air introduced via the intake port 34A of the front panel 34 is conducted to the internal space of the lower side PC board supporting section 42. Therefore, fresh air suitable for cooling can be supplied to the PC boards 24 received in the internal space of the lower side PC board supporting section 42. Then, it is exhausted from the upper end portion of the lower side PC board supporting section 42. Used air exhausted from the lower side PC board supporting section 42 is introduced into the air exhaust cavities 44E and 44F via the portions 48E and 48F of the confluence preventing section 48. Then, it is exhausted to the exterior via the air exhaust port 36B of the rear panel 36. Further, fresh air introduced via the intake port 34A of the front panel 34 is guided into the internal space of the upper side PC board supporting section 44 via the portion 48G of the confluence preventing section 48. Therefore, fresh air suitable for cooling can be supplied to the PC boards 24 received in the internal space of the upper side PC board supporting section 44. Then, it is exhausted to the exterior via the air exhaust port of the upper panel.

Figure 7:
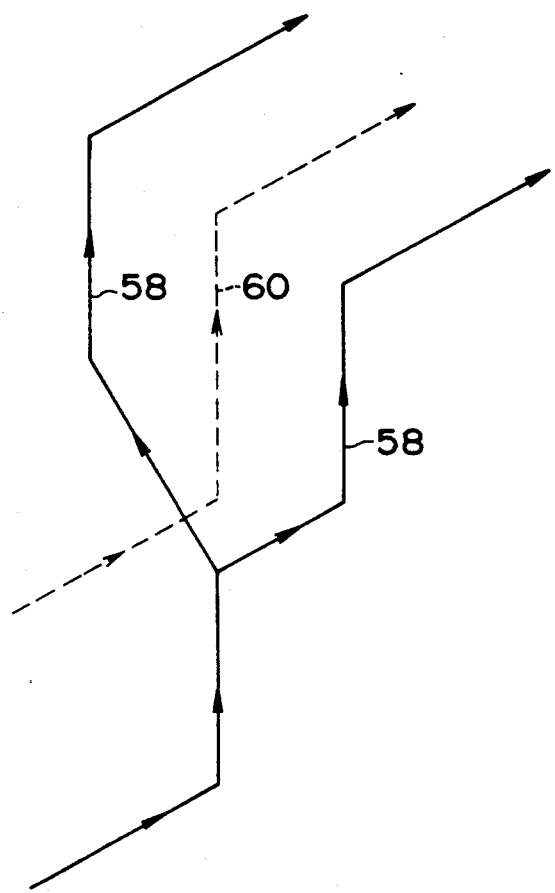
FIG. 7 is a model diagram showing only the flow of air in the housing structure shown in FIG. 4.
Figure 8:
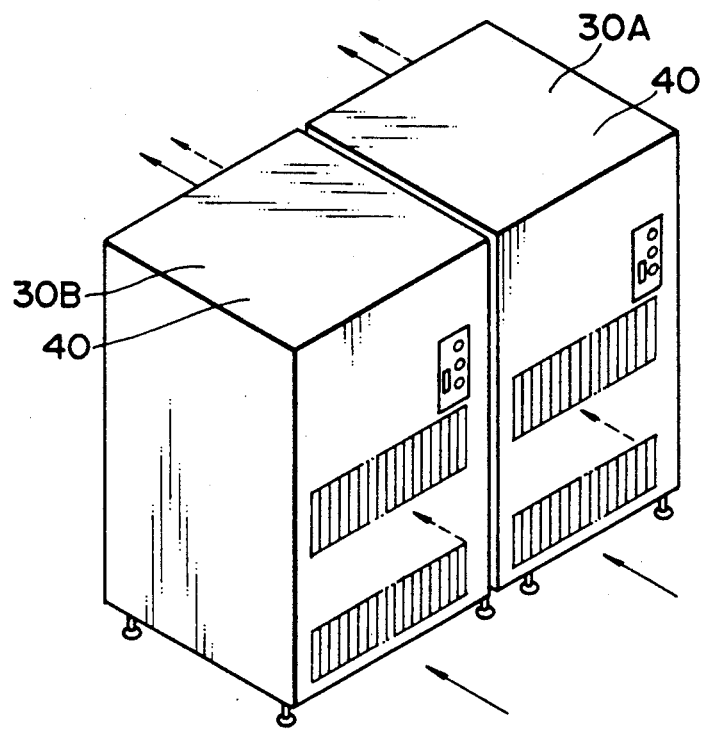
FIG. 8 is a perspective view showing a plurality of housing structures of FIG. 4 arranged in parallel.

The operation of the above-described second embodiment is explained with reference to FIGS. 6, 7 and 8. That is, the lower side housing unit 50 and the upper side housing unit 52 are arranged in a two-storied configuration in the skeleton frame 32. The confluence preventing section 48 is disposed between the lower side PC board supporting section 42 and the upper side PC board supporting section 44. The confluence preventing member 48B provided in the confluence preventing section 48 controls the flow of air introduced via the intake port 34A (34A 1, 34A 2) of the front panel 34. That is, the confluence preventing member 48B causes the used air exhausted from the lower side PC board supporting section 42 to be introduced into the air exhaust cavities 44E and 44F formed in the side portion of the upper side PC board supporting section 44 without introducing the same into the upper side PC board supporting section 44. Therefore, only fresh air which has been introduced via the intake port 34A (34A$_2$) of the front panel 34 and is suitable for cooling is introduced into the internal space of the upper side PC board supporting section 44. Of course, fresh air which has been introduced via the intake port 34A (34A$_1$) of the front panel 34 and is suitable for cooling is introduced into the internal space of the lower side PC board supporting section 42. This will be easily understood by referring to the partial curves attached with arrows indicating the air flow shown in FIGS. 6 and 7. A solid line 58 indicates an air flow passage along which air supplied to the PC boards 24 received in the internal space of the lower side PC board supporting section 42 flows and broken lines 60 indicate an air flow passage along which air supplied to the PC boards 24 received in the internal space of the lower side PC board supporting section 44 flows. It is understood in this example that two air flow passages are formed.

As described above, since air for cooling the PC boards 24 received in the internal space of the lower side PC board supporting section 42 is unused fresh air which has been introduced via the intake port 34A (34A$_1$) of the front panel 34 and is suitable for cooling, the PC boards 24 received in the internal space of the lower side PC board supporting section 42 can be effectively cooled. Further, since air for cooling the PC boards 24 received in the internal space of the upper side PC board supporting section 44 is unused fresh air which has been introduced via the intake port 34A (34A$_2$) of the front panel 34 and is suitable for cooling, the PC boards 24 received in the internal space of the upper side PC board supporting section 44 can be effectively cooled. Therefore, variations will not occur in the electrical characteristics caused by the cooling characteristics of the PC boards 24 received in the internal space of the lower side PC board supporting section 42 and the PC boards 24 received in the internal space of the upper side PC board supporting section 44. For reason, the computer system may be prevented from being erroneously operated.

The main portion of the housing structure 30 is the skeleton frame 32 and the intermediate portion of the skeleton frame 32 is mechanically weak, but since the confluence preventing section 48 is disposed in the intermediate space of the skeleton frame 32 and the confluence preventing section 46 is disposed in the lower side space of the skeleton frame 32, the rigidity of the skeleton frame 32 can be enhanced. Further, since the confluence preventing sections 46 and 48 include the confluence preventing member 48B formed to have a "V-shaped" cross section, the trussed structure can be formed and the rigidity thereof can be enhanced.

Further, as shown in FIG. 6, since an electric fan 36A is mounted on the upper portion of the rear panel 36 of the housing structure 30 as at least one forced air-ventilating means and at least one air exhaust port 36B is provided, air can be effectively exhausted. Therefore, as shown in FIG. 8, two housing structures 30A and 30B can be arranged in a row. Further, it is possible to lay something on the upper panels 40 of the two housing structures 30A and 30B.

Figure 9:
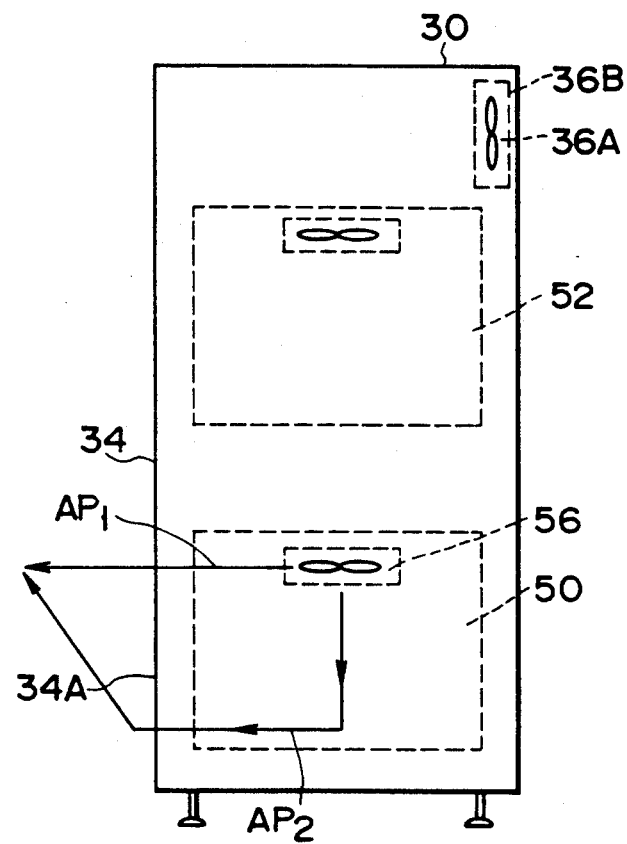
FIG. 9 is a view showing the principle of reducing noises caused by a fan.

Further, since noises caused by the electric fan 36 used as the forced ventilating means will be transmitted to the intake port 34A of the front panel 34 via the lower side PC board supporting section 42 (acoustic propagation distance AP$_2$) instead of being directly transmitted to the intake port 34A of the front panel 34 (acoustic propagation distance AP$_1$) as shown in FIG. 9, the noise can be reduced. The noise reduction can be attained because AP$_2$ > AP$_1$.

Figure 10:
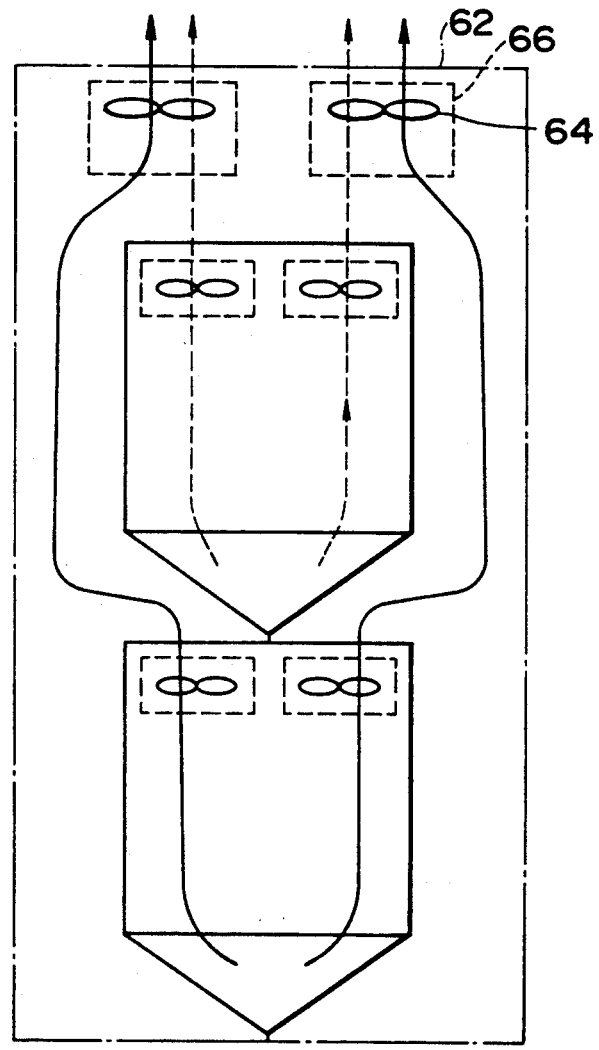
FIG. 10 is a schematic front view showing a modification of the housing structure shown in FIG. 4 together with the flow of air in the housing structure.

The explanation for the first and second embodiments is completed, and now, the explanation for modifications for specified members in the first and second embodiments is made with reference to FIGS. 10 to 16. FIG. 10 shows a modification of the upper panel. The upper panel 62 has at least one electric fan 64 serving as a forced ventilating means disposed on the upper portion thereof and at least one air exhaust port 66 is formed in the upper panel. As a result, air in the housing structure 30 can be exhausted in the upward direction of the upper panel 62 without causing any problem. Therefore, as shown in FIG. 8, two housing structures 30A and 30B can be disposed in a row.

Figure 11:
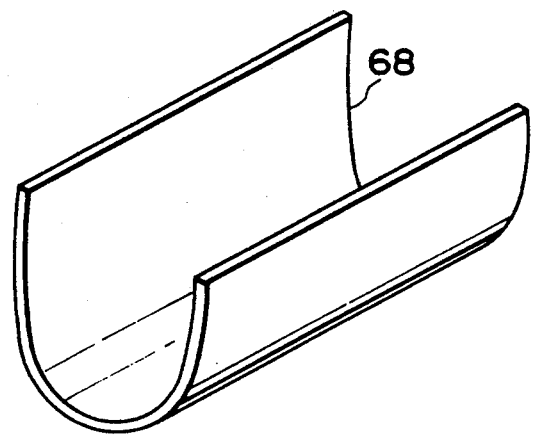
FIG. 11 is a perspective view showing a confluence preventing member having a "U-shaped" cross section.
Figure 12:
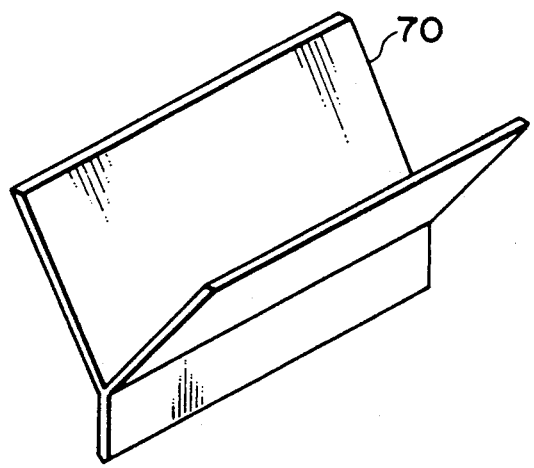
FIG. 12 is a perspective view showing a confluence preventing member having a "Y-shaped" cross section.

FIG. 11 shows a confluence preventing member 68 having a "U-shaped" cross section. FIG. 12 shows a confluence preventing member 70 having a "Y-shaped" cross section. The confluence preventing members 68 and 70 can be used as the confluence preventing member in the first and second embodiments.

Figure 13:
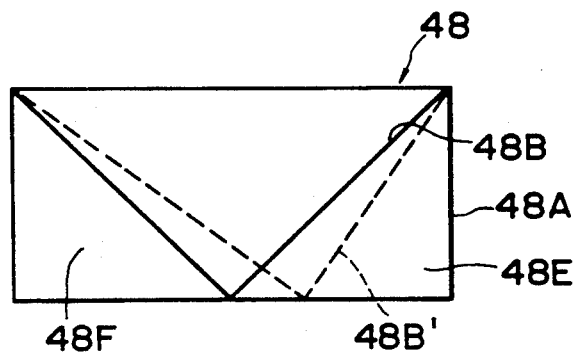
FIG. 13 shows a modification of a flow control section and is a front view showing the inclined state of a confluence preventing member.

FIG. 13 shows the possibility that the cross section of the confluence preventing member 48B of the confluence preventing section 48 can be changed. When a confluence preventing member 48B' having a "V-shaped" cross section as indicated by broken lines is used, the cross sectional areas of portions 48E and 48F in which the confluence preventing member is different from the confluence preventing member 48B can be selectively set. This is suitable in a case where the amounts of heat generated on the right and left sides of the PC boards 24 received in the internal space of the PC board supporting sections 42 and 44 are different from each other.

Figure 14:
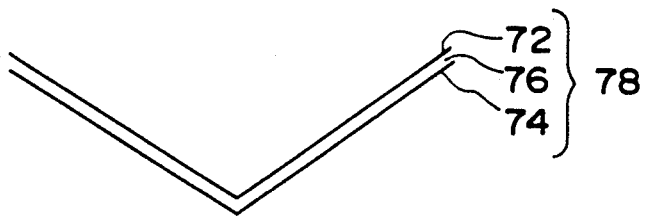
FIG. 14 shows a modification of the confluence preventing member and is a front view showing the confluence preventing member having two plates.
Figure 15:
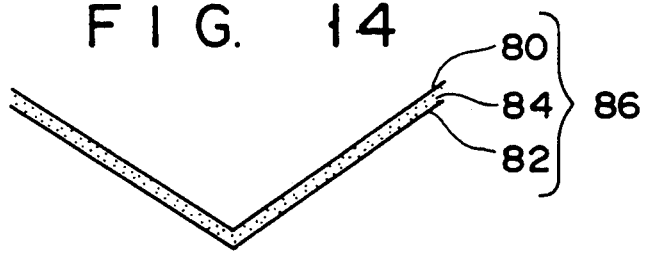
FIG. 15 shows a modification of the confluence preventing member in the housing unit and is a front view showing the confluence preventing member having two plates and an interlaid layer.

FIG. 14 shows a two-layered confluence preventing member 78 which is formed of a first "V-shaped" plate 72 and a second "V-shaped" plate 74 disposed to face each other with a gap 76 therebetween and is different from the afore-mentioned confluence preventing member 48B which is formed of a single plate. FIG. 15 shows a two-layered confluence preventing member 86 which is formed of a first "V-shaped" plate 80 and a second "V-shaped" plate 82 disposed to face each other with a thermally insulative member 84 inserted therebetween. At this time, the thermal shield between the upper portion and lower portion of the two-layered confluence preventing members 76 and 86 can be ensured by forming the first "V-shaped" plates 72 and 80 of heat resistant material.

FIG. 16 shows a modification of the front panel. The front panel 34' has an intake port 34A' formed to extend from the intermediate portion to the lower end portion.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A housing structure for housing a plurality of electric components comprising:
    a skeleton frame member having a hexahedron space defined therein;
    a plurality of panels, disposed on said skeleton frame member, for providing the skeleton frame member with a front panel, a rear panel, a pair of side panels, a bottom panel, and an upper panel;
    at least one air intake section disposed on a portion of said front panel, for introducing air into the hexahedron space in said skeleton frame member from the exterior thereof;
    an air exhaust section disposed on at least one of said upper panel and said rear panel, for exhausting air from the hexahedron space in said skeleton frame member to the exterior thereof;
    a plurality of electric component housing bodies, disposed in the hexahedron space, for housing at least a lower side electric component in a lower side electric component body and an upper side electric component in an upper side electric component body, said plurality of housing bodies forming a storied configuration having at least two stories;
    confluence preventing means disposed in the hexahedron space, for preventing air exhausted from the lower side electric component housing body and air introduced into the upper side electric component housing body from being combined together; and
    an air passage section, formed between said air intake section and said air exhaust section in the hexahedron space in said skeleton frame member, for passing air exhausted from the lower side electric component housing body along said pair of side panels.

2. A housing structure according to claim 1, wherein said air passage section has a plurality of air flow passages for supplying air introduced via said air intake section to said plurality of electric component housing bodies.

3. A housing structure according to claim 1, wherein said air passage section has a plurality of air flow passages for supplying air exhausted from said plurality of electric component housing bodies to said air exhaust section.

4. A housing structure according to claim 1, wherein said air passage section includes at least one forced ventilating means.

5. A housing structure according to claim 1, wherein said air exhaust section includes at least one forced ventilating means.

6. A housing structure according to claim 1, wherein said confluence preventing means includes a member having a "V-shaped" cross section.

7. A housing structure according to claim 1, wherein said confluence preventing means includes a member having a "U-shaped" cross section.

8. A housing structure according to claim 1, wherein said confluence preventing means includes a member having a "Y-shaped" cross section.

9. A housing structure according to any one of claims 6, 7 and 8, wherein said member is disposed in a highly rigid box.

10. A housing structure according to any one of claims 6, 7 and 8, wherein said member is formed of a compound member having a heat resistant characteristic.

11. A housing structure for housing a plurality of electric components comprising:
    a skeleton frame member having a space defined therein for housing a plurality of electric components in a storied configuration having at least two stories;
    a plurality of electric component housing bodies disposed in said skeleton frame member, for housing a plurality of electric components in said storied configuration;
    an air passage section disposed in said space between at least one air intake section and at least one air exhaust section formed in said skeleton frame member; and
    confluence preventing means disposed in said air passage section, for preventing air exhausted from a lower side electric component housing body and air introduced into an upper side electric component housing body from being combined together, said confluence preventing means including means for directing air exhausted from a lower side electric component housing body toward side panels of said housing structure and means for directing intake air into said upper side electric component housing body.

12. A housing structure according to claim 11, wherein said air passage section has a plurality of air flow passages for supplying air introduced via said air intake section to said plurality of electric component housing bodies.

13. A housing structure according to claim 11, wherein said air passage section includes at least one forced ventilating means.

14. A housing structure according to claim 11, wherein said confluence preventing means is disposed in a highly rigid box.

15. A housing structure according to claim 11, wherein said confluence preventing means is formed of a compound member including at least one member having a heat resistant characteristic.

16. A housing structure for housing a plurality of electric components comprising:
    a skeleton frame member having a hexahedron space defined therein,
    a plurality of panels, disposed on said skeleton frame member, for providing the skeleton frame member with a front panel, a rear panel, a pair of side panels, a bottom panel, and an upper panel;

at least one air intake section disposed on a lower side of said front panel, for introducing air into the hexahedron space in said skeleton frame member from the exterior thereof;

an exhaust section disposed on at least one of said upper panel and said rear panel, for exhausting air from the hexahedron space in said skeleton frame member to the exterior thereof;

a plurality of electric component housing bodies, disposed in said air passage section, for housing at least a lower side electric component housing body and an upper side electric component housing body in a storied configuration having at least two stories;

confluence preventing means disposed in at least one of said plurality of electric of electric component housing bodies, for preventing air exhausted from a lower side electric component housing body and air introduced into an upper side electric component housing body of said plurality of electric component housing bodies from being combined together; and an air passage section formed between said air intake section and said exhaust section in the hexahedron space in said skeleton frame member, for passing air along said pair of side panels, said air passage section including a first air flow passage passing through the inside of said upper side electric component housing body for cooling and a second air flow passage passing through the inside of said lower side electric component housing body and the outside of said upper side electric component housing body.

17. A housing structure for housing a plurality of electric components, comprising:

a skeleton frame member having a hexahedron space defined therein;

a plurality of panels, disposed on said skeleton frame member, for providing the skeleton frame member with a front panel, a rear panel, a pair of side panels, a bottom panel, and an upper panel;

a plurality of electric component housing units disposed in the hexahedron space in said skeleton frame member and including at least a lower side electric component supporting section and an upper side electric component supporting section, said lower and upper side electric component supporting sections both having a box-like shape and being arranged in a storied configuration having at least two stories, said lower side and upper side electric component supporting sections each having a pair of side walls, so as to provide a pair of air flow passages between said pair of side walls and said pair of side panels of said skeleton frame member;

at least one air intake section, disposed on a lower portion of said front panel, for introducing air into the hexahedron space in said skeleton frame member from the exterior thereof;

an air exhaust section, disposed on at least one of said upper panel sand said rear panel, for exhausting air from the hexahedron space in said skeleton frame member to the exterior thereof; and confluence preventing means, disposed between said lower side electric component supporting section and said upper side electric component supporting section and having a substantially "V-shaped" cross section, for preventing air exhausted from a lower side electric component supporting section and air introduced into the upper side electric component supporting section from being combined together.

* * * * *